(12) United States Patent
Kim

(10) Patent No.: US 10,656,047 B2
(45) Date of Patent: May 19, 2020

(54) LIQUID LEAKAGE SENSING DEVICE USING ELECTROLYSIS

(71) Applicant: Dong Ecn Kim, Gyeonggi-do (KR)

(72) Inventor: Dong Ecn Kim, Gyeonggi-do (KR)

( * ) Notice: Subject to any disclaimer, the term of this patent is extended or adjusted under 35 U.S.C. 154(b) by 53 days.

(21) Appl. No.: 16/140,643

(22) Filed: Sep. 25, 2018

(65) Prior Publication Data

US 2020/0096414 A1    Mar. 26, 2020

(51) Int. Cl.
*G01M 3/40* (2006.01)
*G01R 27/26* (2006.01)
*G01N 27/02* (2006.01)
*G01M 3/22* (2006.01)
*G01M 3/16* (2006.01)

(52) U.S. Cl.
CPC .............. *G01M 3/40* (2013.01); *G01M 3/16* (2013.01); *G01M 3/165* (2013.01); *G01M 3/228* (2013.01); *G01R 27/2605* (2013.01); *G01N 27/02* (2013.01)

(58) Field of Classification Search
CPC ........ G01R 27/00; G01R 27/02; G01R 27/22; G01R 27/26; G01R 27/2605; G01R 1/00; G01R 1/02; G01R 1/06; G01R 1/067; G01R 1/06794; G01M 3/00; G01M 3/02; G01M 3/04; G01M 3/16; G01M 3/165; G01M 3/20; G01M 3/22; G01M 3/226; G01M 3/228; G01M 3/40; G01N 27/00; G01N 27/02; G01N 27/22; G01N 27/223; G01N 27/226; G01N 27/228; H03M 1/00; H03M 1/12; H03M 1/1205
USPC ....... 324/500, 512, 519, 522, 555, 600, 602, 324/605, 609, 629, 647, 649, 658, 663, 324/664, 665, 672, 679, 693, 694, 713, 324/715, 718, 71.1; 73/37, 40; 340/605
See application file for complete search history.

(56) References Cited

U.S. PATENT DOCUMENTS

| 4,989,447 | A | * | 2/1991 | Gelin | ................... | B65D 90/505 |
| | | | | | | 220/560.03 |
| 5,381,097 | A | * | 1/1995 | Takatori | ................ | G01M 3/045 |
| | | | | | | 174/47 |
| 5,517,181 | A | * | 5/1996 | Gray | ....................... | G01N 27/06 |
| | | | | | | 204/416 |
| 6,652,719 | B1 | * | 11/2003 | Tseng | .................... | C02F 1/4618 |
| | | | | | | 204/257 |
| 2005/0162280 | A1 | * | 7/2005 | Hayashida | ............... | G01M 3/16 |
| | | | | | | 340/605 |

(Continued)

*Primary Examiner* — Hoai-An D. Nguyen
(74) *Attorney, Agent, or Firm* — IP Legal Services, LLC

(57) ABSTRACT

The present invention relates to a liquid leakage sensing device that is capable of dividedly detecting water and chemical solutions in sensing liquid leakage using electrolysis, determining the kind of the leaking liquid detected, and being reused, not disposable. According to the present invention, the liquid leakage sensing device includes: a liquid leakage sensor (10) having a first electrode (11) and a second electrode (12) made of a conductive metal in such a manner as to be facedly spaced apart from each other by a given distance; a voltage/current amplifier (20) adapted to vary a voltage and a current to apply the varied voltage and current to the liquid leakage sensor (10); a current sensor (30) adapted to detect a value of current flowing between the electrodes of the liquid leakage sensor (10); and a controller (40) adapted to controlledly output a voltage applied between the first electrode (11) and the second electrode (12) of the liquid leakage sensor (10).

3 Claims, 6 Drawing Sheets

(56) References Cited

U.S. PATENT DOCUMENTS

2016/0231303 A1* 8/2016 Park .................. G01N 33/2841

* cited by examiner

LIQUID LEAKAGE SENSING DEVICE USING ELECTROLYSIS

BACKGROUND OF THE INVENTION

Field of the Invention

The present invention relates to a liquid leakage sensing device using electrolysis, and more particularly, to a liquid leakage sensing device using electrolysis that is capable of dividedly detecting water and chemical solutions in sensing liquid leakage using the electrolysis, determining the kind of the leaking liquid detected, and being reused, not disposable.

Background of the Related Art

Generally, a liquid leakage sensor is adapted to sense the leakage of water or chemical solutions and has various shapes like a film type sensor using a cable or electrode pattern.

As shown in FIG. 1, for example, a liquid leakage sensor 1 is located to a form of a band on the ground E under a storage tank T in which a chemical solution is stored, so as to sense leakage from the storage tank T.

In case of a film type sensor 1 as shown in FIG. 2, further, two electrodes 3 and 4 are parallel with and spaced apart from each other by a given distance on top of a film layer 2, and leaking liquid L located between the electrodes 3 and 4 is sensed through a driving circuit 5.

By the way, the conventional liquid leakage sensors 1 having the above-mentioned configurations cannot determine whether the leaking liquid L is water or a chemical solution.

In this case, rainwater may be erroneously sensed as a chemical solution.

So as to solve the above-mentioned problems, accordingly, a liquid leakage sensor for sensing a chemical solution has been proposed.

The conventional liquid leakage sensor for sensing a chemical solution is configured to allow chemical to be coated on the surface thereof so as to sense only a specific chemical solution, and if the chemical solution comes into contact with the sensor, the chemical responds to the chemical solution to cause the chemical-coated layer to be broken, thereby sensing the chemical solution.

According to the conventional liquid leakage sensor for sensing a chemical solution, however, the chemical-coated layer is broken so that the sensor cannot be reused, and in this case, the sensor is a high-cost product, so that product competitiveness is substantially lowered.

Also, the conventional film type liquid leakage sensor is attached to the ground, so that it is weak in noise generated from the ground, and due to malfunctions caused by high resistance of the sensor itself, further, fake alerts may be frequently produced.

In case of another conventional liquid leakage sensor having a plurality of sensing holes adapted to detect leaking liquid flowing therethrough, a distance between the adjacent sensing holes is relatively large so that it is impossible to detect a small amount of leaking liquid.

SUMMARY OF THE INVENTION

Accordingly, the present invention has been made in view of the above-mentioned problems occurring in the prior art, and it is an object of the present invention to provide a liquid leakage sensing device that can detect a leaking liquid through the electrolysis of the leaking liquid.

It is another object of the present invention to provide a liquid leakage sensing device that can dividedly detect water and chemical solutions in sensing the liquid leakage and further determine the kind of the leaking liquid detected.

It is still another object of the present invention to provide a liquid leakage sensing device that can be reused, not disposable, in sensing the leakage of a chemical solution.

To accomplish the above-mentioned objects, according to the present invention, there is provided a liquid leakage sensing device including: a liquid leakage sensor having a first electrode and a second electrode made of a conductive metal in such a manner as to be facedly spaced apart from each other by a given distance; a voltage/current amplifier adapted to vary a voltage and a current to apply the varied voltage and current to the liquid leakage sensor; a current sensor adapted to detect a value of current flowing between the electrodes of the liquid leakage sensor; and a controller adapted to controlledly output a voltage applied between the first electrode and the second electrode of the liquid leakage sensor, the voltage being outputted step by step from a voltage under reference electrolysis voltages of set electrolytes to a voltage raisedly above the reference electrolysis voltages, and to detect the current flowing between the first electrode and the second electrode of the liquid leakage sensor to determine the existence and kind of leaking liquid, wherein if an amount of current detected is raised correspondingly to the reference electrolysis voltage of a given electrolyte, at the time when the leaking liquid is sensed on the liquid leakage sensor, the controller determines that the leaking liquid is the corresponding chemical solution.

According to the present invention, desirably, the reference electrolysis voltages are set with surface areas of the first electrode and the second electrode, kinds of the leaking liquid, and densities of the leaking liquid, as basic variables.

According to the present invention, desirably, the first electrode and the second electrode of the liquid leakage sensor are made of stainless steel or carbon having high corrosion resistance.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENTS

Now, an explanation on a liquid leakage sensing device using electrolysis according to the present invention will be given with reference to the attached drawings.

Figure 1:
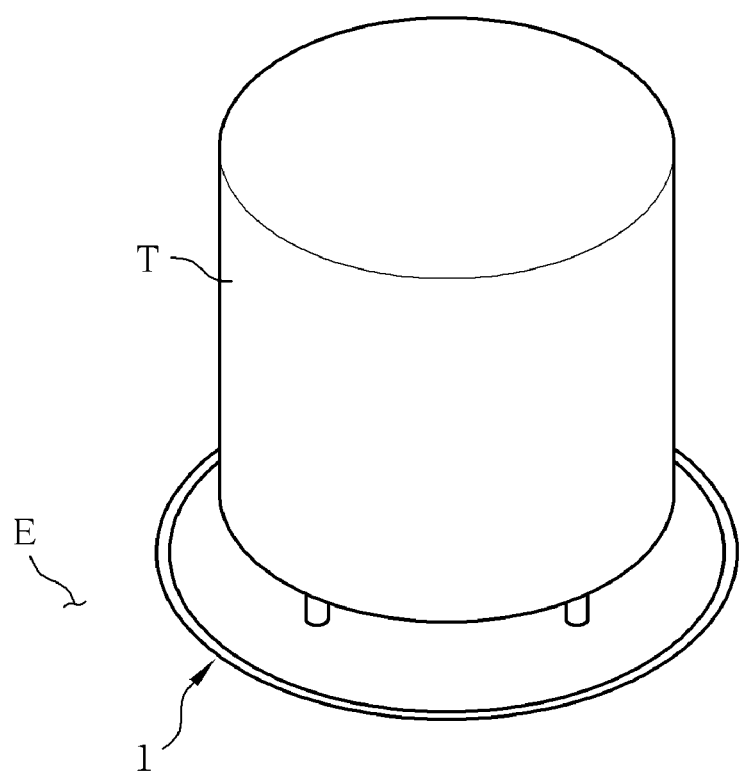
FIG. 1 is a perspective view showing one example of conventional liquid leakage sensors.
Figure 2:
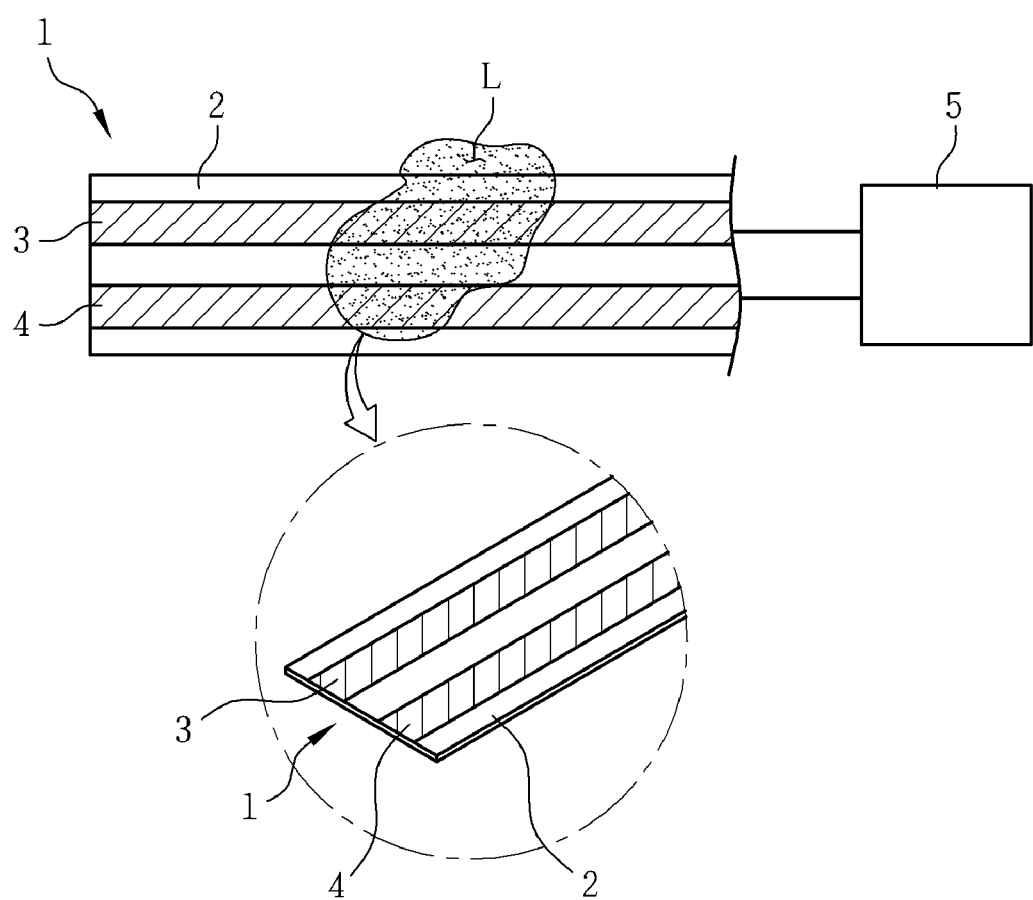
FIG. 2 is a top view showing another example of the conventional liquid leakage sensors.
Figure 3:
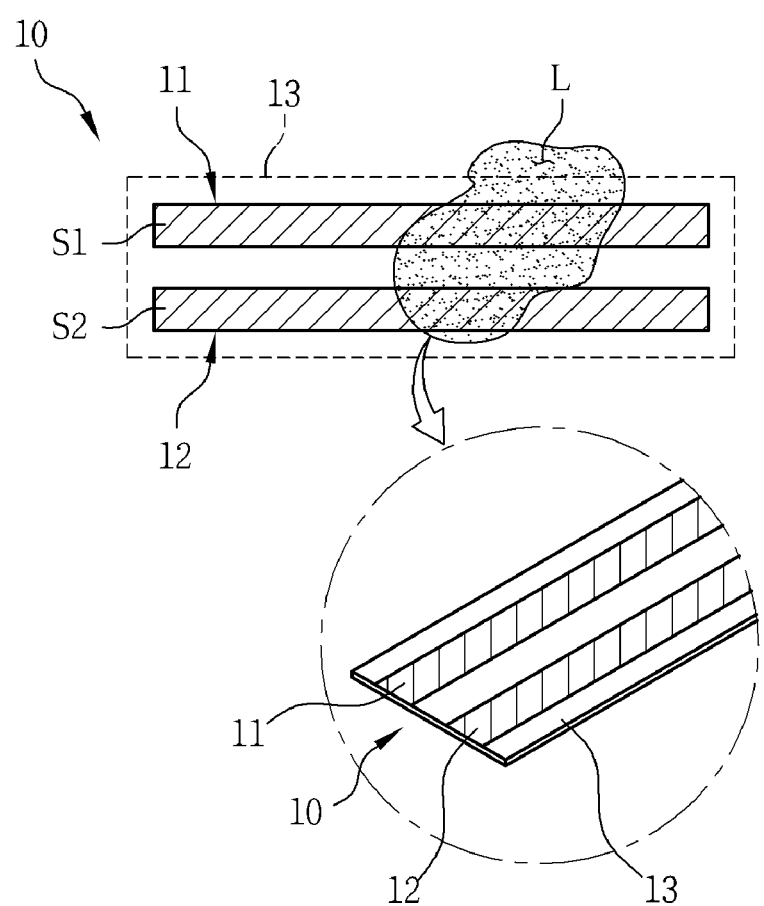
FIG. 3 is a top view showing a liquid leakage sensor applied to the present invention.

FIG. 3 is a top view showing a liquid leakage sensor applied to the present invention.

As shown, the liquid leakage sensor 10 applied to the present invention includes a first electrode 11 and a second electrode 12 made of a conductive metal in such a manner as to be facedly spaced apart from each other by a given distance.

As shown in FIG. 3, the first electrode 11 and the second electrode 12 have shapes of bands parallel with and spaced apart from each other by the given distance, and a base member 13 is formed on the undersides of the first electrode 11 and the second electrode 12 to fix the first electrode 11 and the second electrode 12 thereto. However, the formation of the base member 13 is not necessarily needed.

Further, the first electrode 11 and the second electrode 12 may be applied to electrodes for a liquid leakage pointer sensor and a water level sensor as well as for the band type sensor.

The liquid leakage sensor 10 serves to sense leaking liquid L coming into contact with the first electrode 11 and the second electrode 12. At this time, the sensing is carried out not by means of a conventional simple electric current applying method wherein electric current flows to the first electrode 11 and the second electrode 12 through a conductive material contained in the leaking liquid L, but by means of electrolysis wherein the leaking liquid L is electrolyzed with the first electrode 11 and the second electrode 12, thereby sensing the leaking liquid L with the current value generated through the electrolysis.

Now, an electrolysis voltage will be explained so as to make the present invention easily understood.

First, the electrolysis voltage is a voltage applied between two electrodes, that is, anode and cathode to conduct electrolysis, and is determined according to the materials of the anode and cathode and the kind of an electrolyte.

Theoretically, water has an electrolysis voltage of 1.23 V or more, but due to catalysis and ionization of the electrodes, actually, at the time when an electrolysis voltage of 1.6 V or more is applied, the electrolysis can be carried out.

Figure 6:
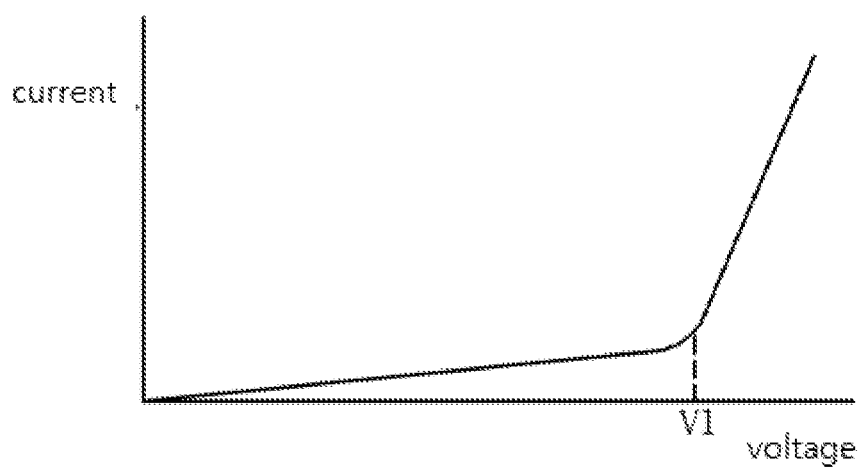
FIG. 6 is a graph showing the relationship between an electrolysis voltage and an electric current according to the present invention.

If a reference electrolysis voltage V1 at which the electrolysis starts is applied to the electrodes, like this, a current is drastically raised, as shown in FIG. 6.

If ionization materials are contained in the electrolyte, the reference electrolysis voltage V1 is changed, and in consideration of such concept, the liquid leakage sensing device according to the present invention can determine the kind of the leaking liquid L as the electrolytes by means of the electrolysis.

For example, electrolysis voltages according to kinds of electrolytes are obtained like the following Table 1.

TABLE 1

| Electrolyte | Electrolysis voltage (V) |
|---|---|
| Cyanide copper | 1.5 |
| Nickel sulfate | 2.09 |
| Nickel chloride | 2.35 |
| Zink sulfate | 2.35 |
| Chromic acid | 2.8 |
| Cupric sulfate | 1.49 |
| Sulfate | 1.67 |
| Sodium hydroxide | 1.69 |
| Silver nitrate | 0.7 |

According to the present invention, therefore, the electrolysis voltages V (hereinafter, referred also to as 'reference electrolysis voltages V1' by electrolyte) are variedly supplied to the first electrode 11 and the second electrode 12, so that leaking liquids are detected through an amount of current flowing to the electrodes, and, of course, the kinds of the leaking liquids are determined.

Amounts of current by the electrolyte (leaking liquid) according to the reference electrolysis voltages V1 are differently obtained according to surface areas S1 and S2 of the first electrode 11 and the second electrode 12, the kinds of electrolytes (leaking liquids), and the densities of the electrolytes (leaking liquids). Accordingly, the surface areas S1 and S2 of the first electrode 11 and the second electrode 12, the kinds of electrolytes, and the densities of the electrolytes are used as basic variable set values.

Further, the first electrode 11 and the second electrode 12 of the liquid leakage sensor 10 are made of stainless steel SUS or carbon having high corrosion resistance.

Figure 4:
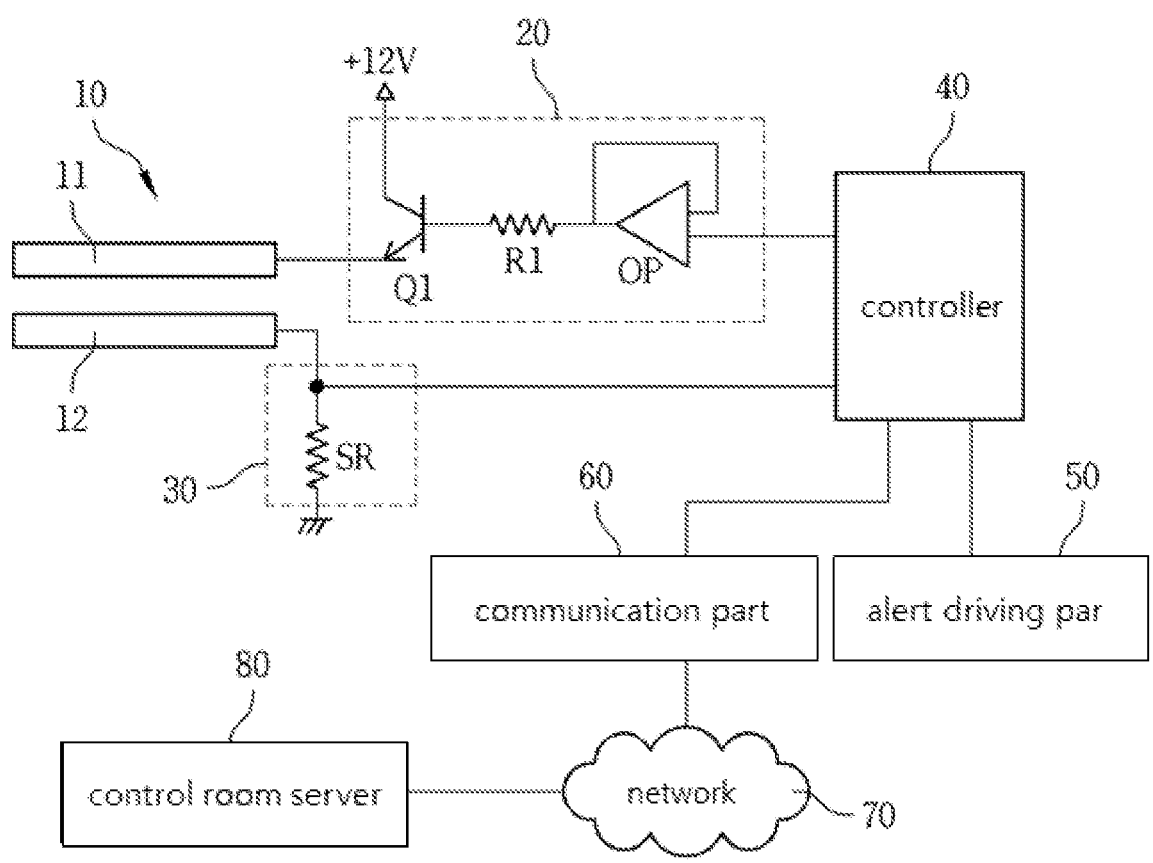
FIG. 4 is a circuit block diagram showing a liquid leakage sensing device using electrolysis according to the present invention.

FIG. 4 is a circuit block diagram showing a liquid leakage sensing device using electrolysis according to the present invention.

As shown, the liquid leakage sensing device using electrolysis according to the present invention includes the liquid leakage sensor 10 having the first electrode 11 and the second electrode 12, a voltage/current amplifier 20, a current sensor 30, a controller 40, an alert driving part 50, and a communication part 60.

The voltage/current amplifier 20 is adapted to vary a voltage and a current to apply the varied voltage and current to the liquid leakage sensor 10.

The voltage/current amplifier 20 is configured to allow the control output of the controller 40 to be inputted to an amplifier OP and then applied to the first electrode 11 through a resistor R1 and a transistor Q1.

The current sensor 30 is adapted to detect a value of the current flowing between the electrodes of the liquid leakage sensor 10 to allow the value of the current flowing to the liquid leakage sensor 10 to be inputted to the controller 40 through a shunt resistor SR connected to the second electrode 12.

The controller 40 is adapted to controlledly output a voltage applied between the first electrode 11 and the second electrode 12 of the liquid leakage sensor 10, and in this case, the voltage is raisedly outputted step by step from a theoretical electrolysis voltage of water to reference electrolysis voltages of set electrolytes, so that the current flowing between the first electrode 11 and the second electrode 12 of the liquid leakage sensor 10 is detected to determine whether the leaking liquid L exists.

If an amount of current detected is small when compared with the surface areas S1 and S2 of the first electrode 11 and the second electrode 12, in a state where no electrolysis occurs at the time when the leaking liquid L is sensed on the liquid leakage sensor 10, the controller 40 determines that the leaking liquid L is water.

Contrarily, if an amount of current detected is raised correspondingly to the reference electrolysis voltage of a given electrolyte, in a state where electrolysis occurs at the time when the leaking liquid L is sensed on the liquid leakage sensor 10, the controller 40 determines that the leaking liquid L is the corresponding chemical solution.

If the leaking liquid L is detected, also, the controller 40 cuts off the power applied to the first electrode and the second electrode 12 to protect the liquid leakage sensor 10 from the leaking liquid L, so that alert is generated and leakage information is transferred to an external control room server 80 through network 70.

The alert driving part 50 generates an alarming sound for the occurrence of the leakage under the control of the controller 40.

The communication part 60 is connected to the control room server 80 through the network 70 to transfer the leakage sensing information of the controller 40 to the control room server 80.

Figure 5:
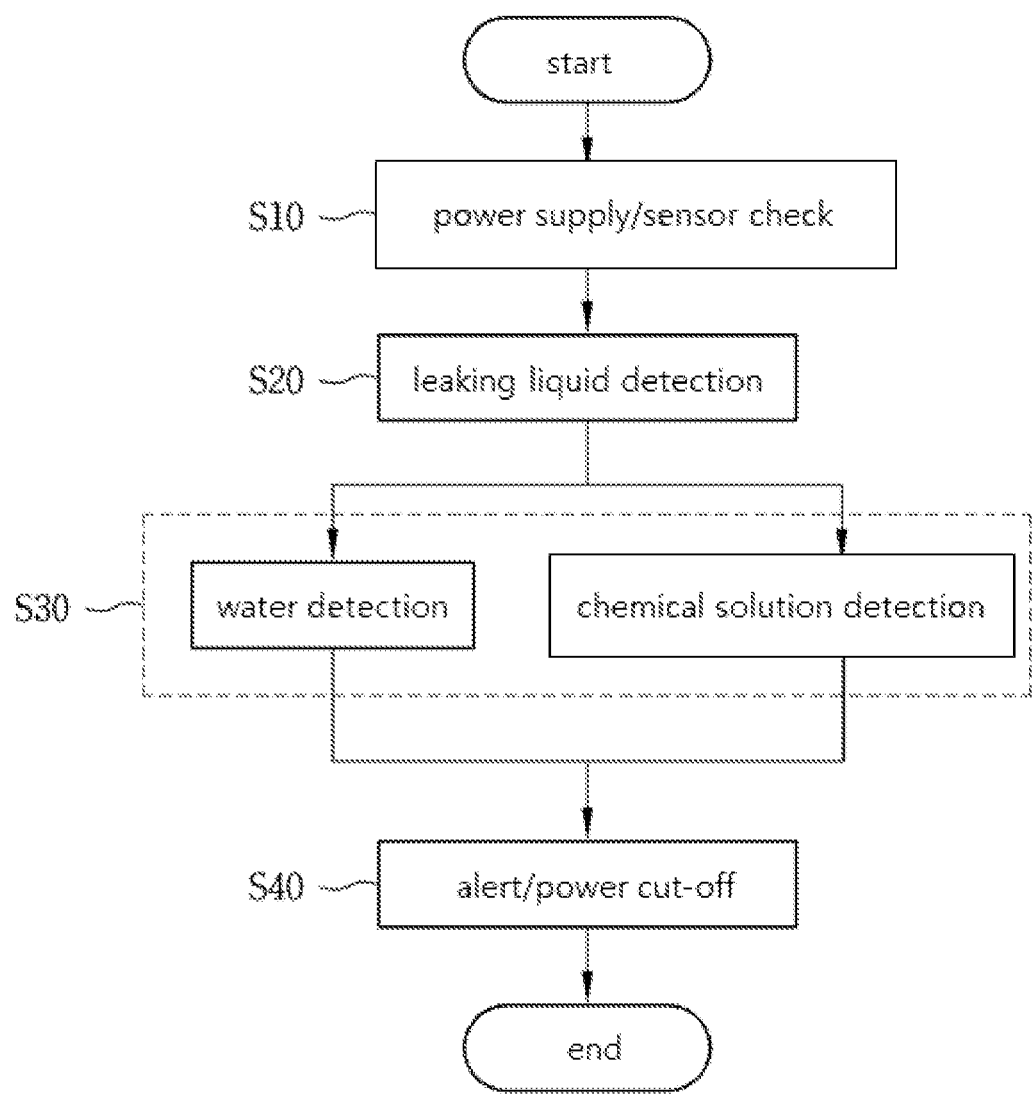
FIG. 5 is a flowchart showing a control process of the liquid leakage sensing device according to the present invention.

Under the above-mentioned configuration, now, the whole operation of the liquid leakage sensing device using the electrolysis according to the present invention will be in detail explained with reference to FIG. 5.

If power is applied, first, the controller 40 applies a voltage of DC 1.23 V to the first electrode 11 and the second electrode 12 of the liquid leakage sensor 10 through the voltage/current amplifier 20 to check (initialize) a state of the liquid leakage sensor 10 (at step S10).

Next, the voltage supplied to the liquid leakage sensor 10 is raised sequentially to the reference electrolysis voltages of the set electrolytes, and accordingly, the current flowing to the liquid leakage sensor 10 is detected through the current sensor 30 (at step S10).

In this case, if no current value is detected through the current sensor 30, the above-mentioned steps (S10 and S20) are repeatedly carried out.

If a given current value is detected through the current sensor 30 in the process (S20) of the liquid leakage detection, however, the controller 40 determines that the leaking liquid L exists. At this time, if the value of current detected is small when compared with the surface areas S1 and S2 of the first electrode 11 and the second electrode 12, the controller 40 determines that the leaking liquid L is water, to which the current flows, as a conductive material, in a state where no electrolysis occurs.

Further, if the value of current detected is raised correspondingly to the reference electrolysis voltage V1 of a given electrolyte, the controller 40 determines that the leaking liquid L is the corresponding chemical solution, in a state where electrolysis occurs (at step S30).

If the leaking liquid L is detected, the controller 40 cuts off the power applied to the first electrode and the second electrode 12 to protect the liquid leakage sensor 10 from the leaking liquid L.

Next, an alert signal is outputted to the alert driving part 50, and in this case, only when the leakage of the set chemical solution is sensed, the alert signal can be outputted (at step S40).

Moreover, the controller 40 determines the kinds of the leaking liquid L according to the reference electrolysis voltages V1, calculates information on leakage amounts, and transfers the information to the control room server 80 through the communication part 60 and the network 70, thereby making it possible to perform remote control.

As described above, the liquid leakage sensing device using electrolysis according to the present invention can detect very precisely the leaking liquid through a new sensing method using the electrolysis of the leaking liquid.

In addition, the liquid leakage sensing device according to the present invention can dividedly detect water and chemical solutions in sensing the liquid leakage and further determine the kind of the leaking liquid detected.

Further, the liquid leakage sensing device according to the present invention can be reused, not disposable, in sensing the leakage of a chemical solution, thereby achieving cost reduction.

Furthermore, the liquid leakage sensing device according to the present invention can detect liquid leakage by means of an electrolysis voltage difference having rainwater or a chemical solution, while the detection of the liquid leakage is being carried out through the measurement of current, without having any influence of power noise from the ground.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

What is claimed is:

1. A liquid leakage sensing device using electrolysis, comprising:
   a liquid leakage sensor having a first electrode and a second electrode made of a conductive metal in such a manner as to be facedly spaced apart from each other by a given distance;
   a voltage/current amplifier adapted to vary a voltage and a current to apply the varied voltage and current to the liquid leakage sensor;
   a current sensor adapted to detect a value of current flowing between the electrodes of the liquid leakage sensor; and
   a controller adapted to controlledly output a voltage applied between the first electrode and the second electrode of the liquid leakage sensor, the voltage being outputted step by step from a voltage under reference electrolysis voltages of set electrolytes to a voltage raisedly above the reference electrolysis voltages, and to detect the current flowing between the first electrode and the second electrode of the liquid leakage sensor to determine the existence and kind of leaking liquid, wherein if an amount of current detected is raised correspondingly to the reference electrolysis voltage of a given electrolyte, at the time when the leaking liquid is sensed on the liquid leakage sensor, the controller determines that the leaking liquid is the corresponding chemical solution.

2. The liquid leakage sensing device according to claim 1, wherein the reference electrolysis voltages are set with surface areas of the first electrode and the second electrode, kinds of the leaking liquid, and densities of the leaking liquid, as basic variables.

3. The liquid leakage sensing device according to claim 1, wherein the first electrode and the second electrode of the liquid leakage sensor are made of stainless steel or carbon having high corrosion resistance.

* * * * *